(12) United States Patent
Preonas

(10) Patent No.: US 7,371,977 B1
(45) Date of Patent: May 13, 2008

(54) RF SHIELD AND METHOD FOR FABRICATING THE SAME

(75) Inventor: Diamantis Drakos Preonas, Albuquerque, NM (US)

(73) Assignee: L-3 Services, Inc., Albuquerque, NM (US)

( * ) Notice: Subject to any disclaimer, the term of this patent is extended or adjusted under 35 U.S.C. 154(b) by 0 days.

(21) Appl. No.: 11/258,386

(22) Filed: Oct. 26, 2005

(51) Int. Cl.
*H05K 9/00* (2006.01)
*H02B 1/56* (2006.01)
(52) U.S. Cl. ........................... 174/383; 454/184
(58) Field of Classification Search ............. 174/383, 174/390; 361/816, 818; 454/184
See application file for complete search history.

(56) References Cited

U.S. PATENT DOCUMENTS

| | | | | |
|---|---|---|---|---|
| 5,401,914 A | * | 3/1995 | Curran et al. ............. | 174/383 |
| 5,928,076 A | * | 7/1999 | Clements et al. ........... | 454/184 |
| 6,000,767 A | * | 12/1999 | Liu et al. ................ | 312/223.2 |
| 6,252,161 B1 | * | 6/2001 | Hailey et al. ............. | 174/383 |
| 6,297,446 B1 | * | 10/2001 | Cherniski et al. .......... | 174/383 |
| 6,426,459 B1 | * | 7/2002 | Mitchell .................. | 174/382 |
| 7,183,500 B2 | * | 2/2007 | Campini et al. ............ | 174/392 |
| 7,199,310 B2 | * | 4/2007 | Cochrane ................... | 174/383 |

* cited by examiner

*Primary Examiner*—Hung V. Ngo
(74) *Attorney, Agent, or Firm*—Rothwell, Figg, Ernst & Manbeck, P.C.

(57) ABSTRACT

An RF shield is fabricated from a solid piece of metal or metal alloy. Holes are cut through the metal or metal alloy at fixed positions to form an array. The diameter of the holes is selected to be significantly smaller than the RF wavelength (e.g., $\tfrac{1}{3}$) it is designed to prevent from passing through the holes. The thickness of the plate (length of the holes) establishes the attenuation of the shield. The number of holes establishes the air or other fluid throughput.

15 Claims, 10 Drawing Sheets

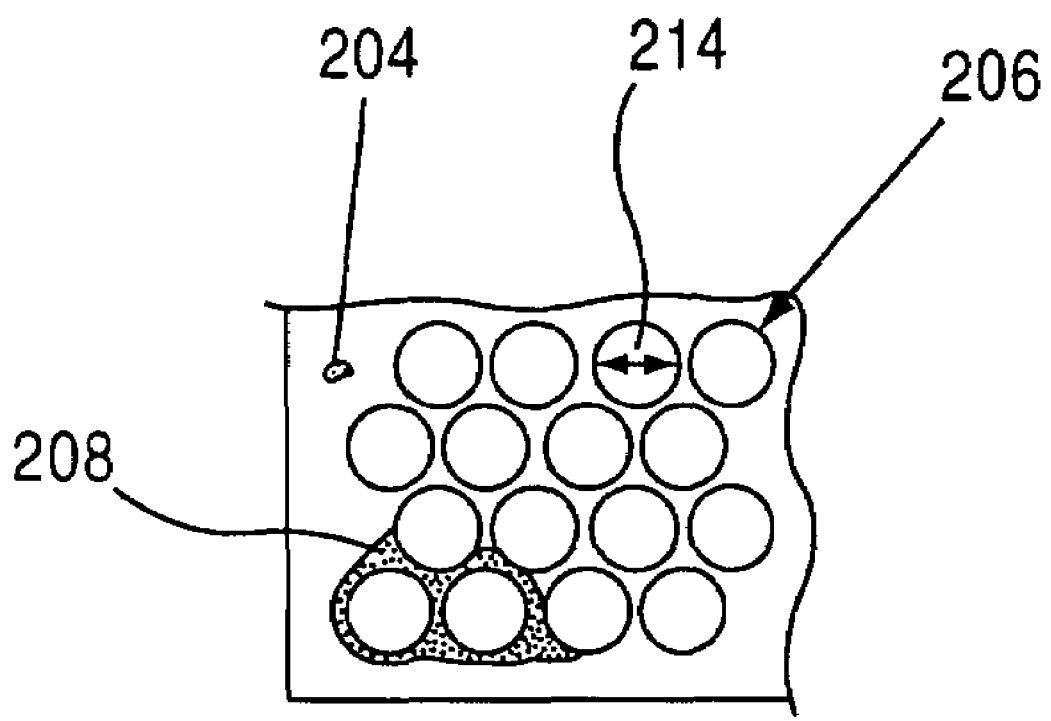

RF SHIELD AND METHOD FOR FABRICATING THE SAME

BACKGROUND OF THE INVENTION

1. Field of the Invention

The present invention relates generally to products and methods for preventing electro-magnetic interference. More particularly, the present invention relates to a conductive and arbitrarily strong radio frequency (RF) shield that protects electronic equipment from being disrupted by RF waves while also allowing for fluid or air flow therethrough, and a method for making the RF shield.

2. Description of the Related Art

For many years, it has been known that electro-magnetic fields, such as RF waves, can disrupt the operation of electronic equipment and cause electronic equipment to malfunction. For example, the RF energy radiated from a nearby lightning strike, sometimes referred to as an electro-magnetic pulse (EMP), can disrupt sensitive electronic equipment or RF from a vacuum cleaner motor can disrupt a television. It is well known that conductive shielding can be effective in preventing RF waves from penetrating a given volume. Therefore, conductive shielding (RF shielding) has been implemented to protect electronic equipment.

The classic RF shield is called a "Faraday cage," which is a conducting cage or perimeter that conducts electromagnetic energy on its surface so that electro-magnetic radiation from outside of the cage will be distributed on the outer surface of the Faraday cage and will not pass through the cage into the interior, thus preventing disruption to any equipment within the cage. Faraday cages are often used to shield sensitive electronic or electro-mechanical equipment. The cages can be made of a solid conductor and fabricated in many shapes and sizes, and used in combination with other shields.

Often, there is a need to provide for openings in RF shielding to allow for fluid or air flow from outside the shielding to the inside or to provide visual access to the interior. For example, electronic equipment may require ventilation, electro-mechanical equipment may need to be able to receive coolant and to vent exhaust, or human operators working within a protected volume may require HVAC. Examples of such applications can include news vans, satellite up-links, aircraft cockpits, diesel generators, mobile switching stations and medical diagnostics laboratories.

A number of solutions have been offered to address the above-problem. For example, metallic screens have been proposed and implemented. Such screens can be found on the doors of home microwave ovens. Metallic screens also form the walls of the classic "screen room" which can provide adequate shielding for some applications while being somewhat transparent and provide for ventilation. However, metallic screens provide quite limited RF attenuation and are structurally weak.

"Honeycomb" shielding, such as silver-soldered and brazed-foil honeycombing attenuates RF energy better than screens. Honeycomb panels are formed by folding strips metal foil into a crenulated pattern then bonding them together forming hexagonal or square apertures. Honeycomb shielding is still relatively delicate and is not strong enough to handle stresses in many circumstances, such as in a vibrating environment (e.g., a moving vehicle, a pulsating flow, etc.).

A third type of shielding, called a "tube pack", is formed by seam welding a plurality of metal tubes together. This type of shielding provides the shielding effectiveness of honeycomb panels, is mechanically much stronger than screens or honeycomb panels, and can be used in a number of applications where screening or honeycombs cannot. The principal disadvantages of "tube packs" are their fabrication complexity with all the joints having to be seam welded, the volume taken by the assembled "tube pack", and in some cases the weight of the assembly.

In the examples noted above both the honeycomb panels and the "tube packs" can provide adequate RF shielding; for many applications the metallic screens cannot. Honeycomb panels are not structurally strong enough to hand hostile environments. Tube packs can be structurally strong but require a considerable volume and weight allocation and are very expensive to fabricate.

Thus, there is a need for improved RF shields that can be made arbitrarily strong and withstand harsh environments that impose, for example, consistent vibration, corrosion, extreme temperature and other stress inducing conditions and yet be compact and lightweight compared to the alternatives.

SUMMARY OF THE INVENTION

According to an embodiment of the present invention, a product and method is provided for shielding RF signals. An RF shield is provided that blocks electromagnetic radiation while allowing for fluid or air flow therethrough. The shield may include a sheet of metal or metal alloy. The metal or metal alloy sheet has a predetermined thickness measured in a first direction, and cross-sectional area in a first plane perpendicular to the first direction. The sheet has an array of holes therethrough in the first direction.

According to another embodiment of the present invention, a method is provided for manufacturing an RF shield for blocking electromagnetic radiation while allowing for fluid or air flow therethrough. The method includes steps of (a) providing a solid piece of metal or metal alloy having a pre-selected length, width, and thickness; (b) forming an array of holes therethrough in a direction perpendicular to said length and said width; wherein each of said holes in said array has a diameter less than $\frac{1}{3}$ said thickness.

The RF shield of the present invention can be manufacturers from a number of metals or metal alloys, such as stainless steel, copper, or aluminum. The RF shield could also or alternatively be metal plated (e.g., nickel) for corrosion resistance.

Further applications and advantages of various embodiments of the present invention are discussed below with reference to the drawing figures.

BRIEF DESCRIPTION OF THE DRAWINGS

FIG. 2b is a exploded view of a portion of the RF Shield of FIG. 2a.

DETAILED DESCRIPTION OF THE PREFERRED EMBODIMENTS

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

According to an embodiment of the present invention, an RF shield is provided that can be fabricated to be arbitrarily strong and is particularly useful for applications in hostile environments. RF shields according to the present invention are particularly useful in mobile apparatuses required to withstand harsh travel conditions.

Figure 1:
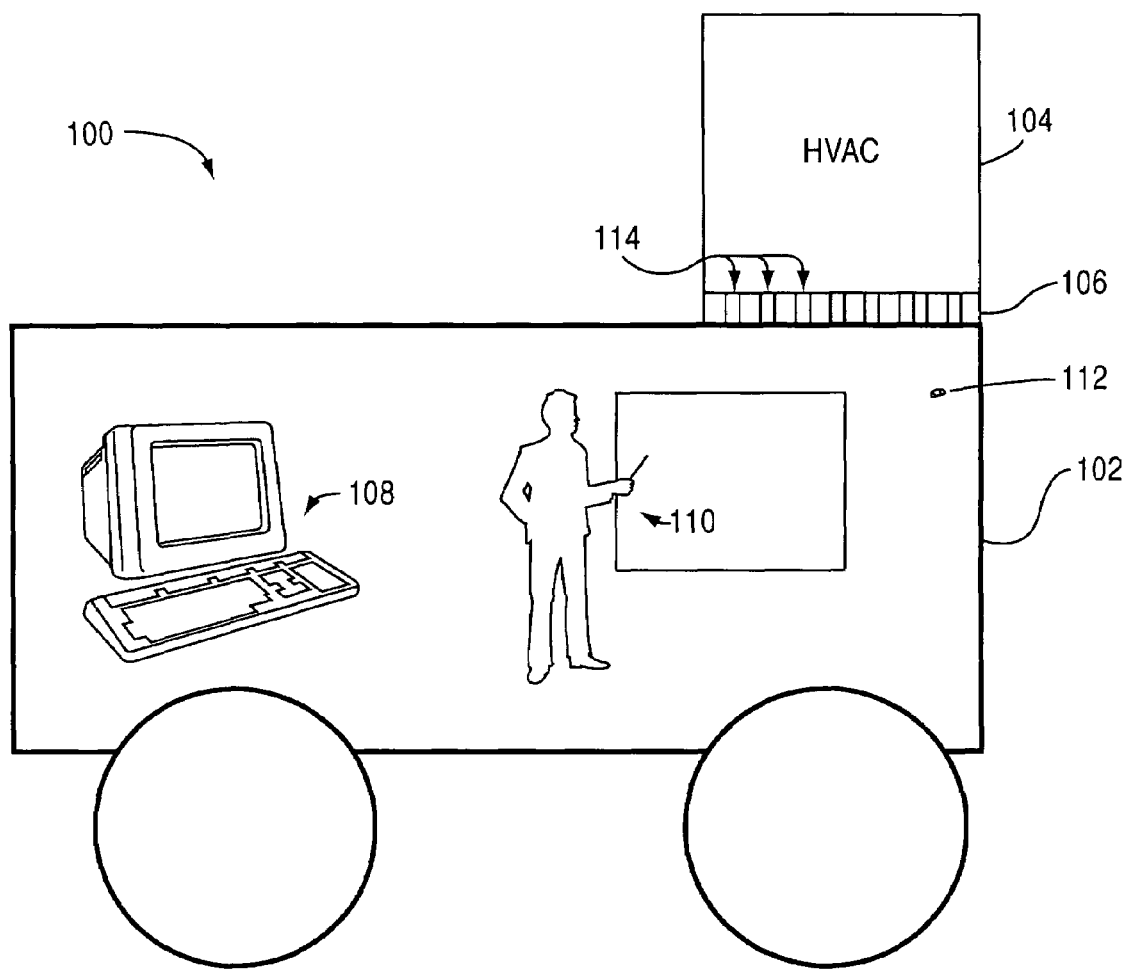
FIG. 1 is a block diagram of a mobile apparatus having a Faraday cage which includes an RF shield according to an embodiment of the present invention.

FIG. 1 is a diagram of a mobile apparatus with shielding. The mobile apparatus 100 houses computer equipment 108 and human operators 110. A solid exterior conductive wall 102 protects the computer equipment from external radiation, such as RF interference.

In order to maintain a satisfactory interior climate in the apparatus 100, an HVAC unit 104 is provided. The HVAC unit 104 provides temperature controlled fresh air flow to the interior of the apparatus 100. However, a breach in the exterior walls 102 is required to allow for the air flow. The breach will be of such a size that RF interference could penetrate the breach. An RF shield 106 is therefore provided at the breach to allow free flow of air between the HVAC unit 104 and the interior 112 of the apparatus 100.

In order to prevent RF interference from leaking through the breach, the RF shield 106 is fabricated from a solid piece of conductive material, such as aluminum or steel, and includes a plurality of holes 114 to allow for air flow therethrough. The size of the holes can be selected based on the wavelength of the interference to be blocked by the RF shield 106; the length of the holes determines the level of attenuation achieved; and the number of holes is determined by the desired amount of fluid or air flow.

Figure 2A:
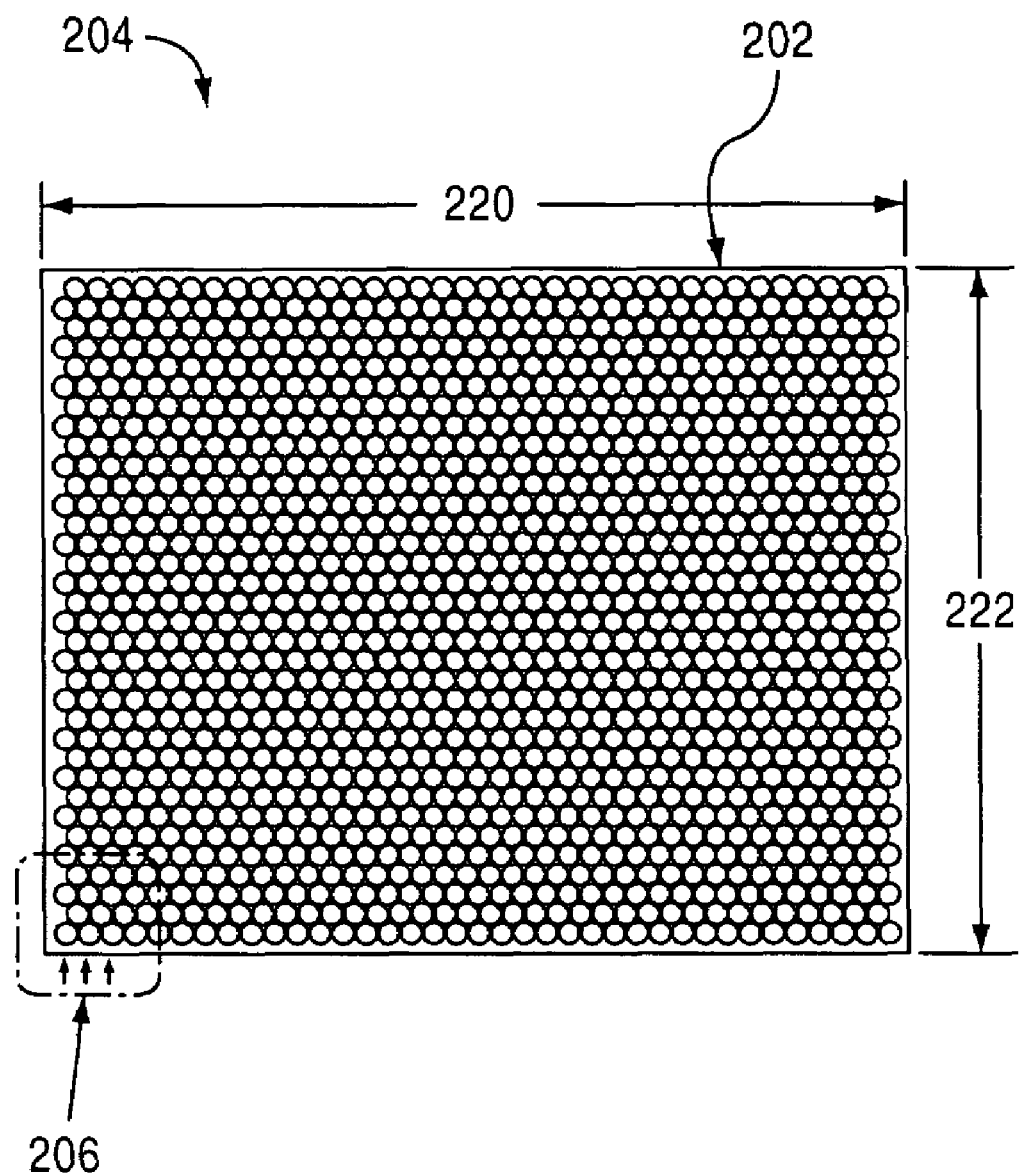
FIG. 2a is a top view of an RF shield according to an embodiment of the present invention.

Referring to FIG. 2a, an RF shield 204 preferably includes a solid, conductive metal or metal alloy sheet (or slab) 202 having a plurality of holes 206 therethrough to form an array of holes. This novel type of RF shield is also called a "wavepack" or "wavepack filter." The solid metal between the holes (208 in FIG. 2b) provides the RF shield with structural rigidity. By varying composition and thickness of the sheet 202, the spacing 208 between the holes, and diameter of the holes 206 in the sheet 202, the RF shield 204 may be made arbitrarily strong. By fabricating the wavepack out of a solid piece of metal or metal alloy, it becomes much easier to weld the wavepack into a structure than prior are honeycomb panels since extraordinary care is needed to prevent melting the silver solder holding the foil core to the frame of the honeycomb RF filter while welding the frame in place.

A number of methods can be used to form the holes 206 in the sheet 202. For example, the holes 206 can be mechanically drilled, cut with application of extremely-high pressure water (water-jet fabrication), and other manufacturing methods. In the case of water-jet cut holes, the holes themselves can have an arbitrary shape such as a hexagon or square to match the hole pattern of the sheet 202.

The RF shield 204 may be fabricated from any material which can shield the interior of the volume from electromagnetic radiation, such as, conductive metal or metal alloys. Aluminum and steel and alloys thereof are preferred because of the ease of mating them into the similar metal walls of the Faraday cage. However, other metal or metal alloys are contemplated such as copper, zinc, zirconium, titanium, etc. Non-metal conductors may be considered as well. Further, although presently considered impractical, non-conductive materials, such as plastics, could be used to form the RF shield and a layer of conductive metal plating could be provided thereon.

The RF shield 204 may be fabricated into any shape (e.g., flat, cube-like, spherical, etc.). Multiple shields 204 may be connected together to accomplish the same. That is, for example, multiple rectangular shields 204 may be connected together to create a larger panel or multiple panels may be arranged into any arbitrary shape such as a cube.

Multiple shields may be used to protect a volume from RF interference. For example, separate shields can form the supply and return ducts of an air conditioning unit, for interior partitions, or even to provide visible access (a window) in the Faraday cage wall. Again, any shapes can be formed to protect any given volume (e.g., spherical, triangular, pyramid, etc.).

The plurality of shield holes 206 are spaced apart and of a diameter that will provide desired RF shielding, weight, strength and durability. For example, as shown in FIG. 2b, if the holes 206 are increased in diameter 214 (or the space between the holes is decreased in size), the amount of material between the holes 208 will decrease proportionately, thereby reducing the weight of the shield as well as the strength. One skilled in the art should understand that the thickness of the slab, the size of the holes, the number of the holes, and the spacing between the holes can be varied in order to optimize the shielding.

Figure 3:
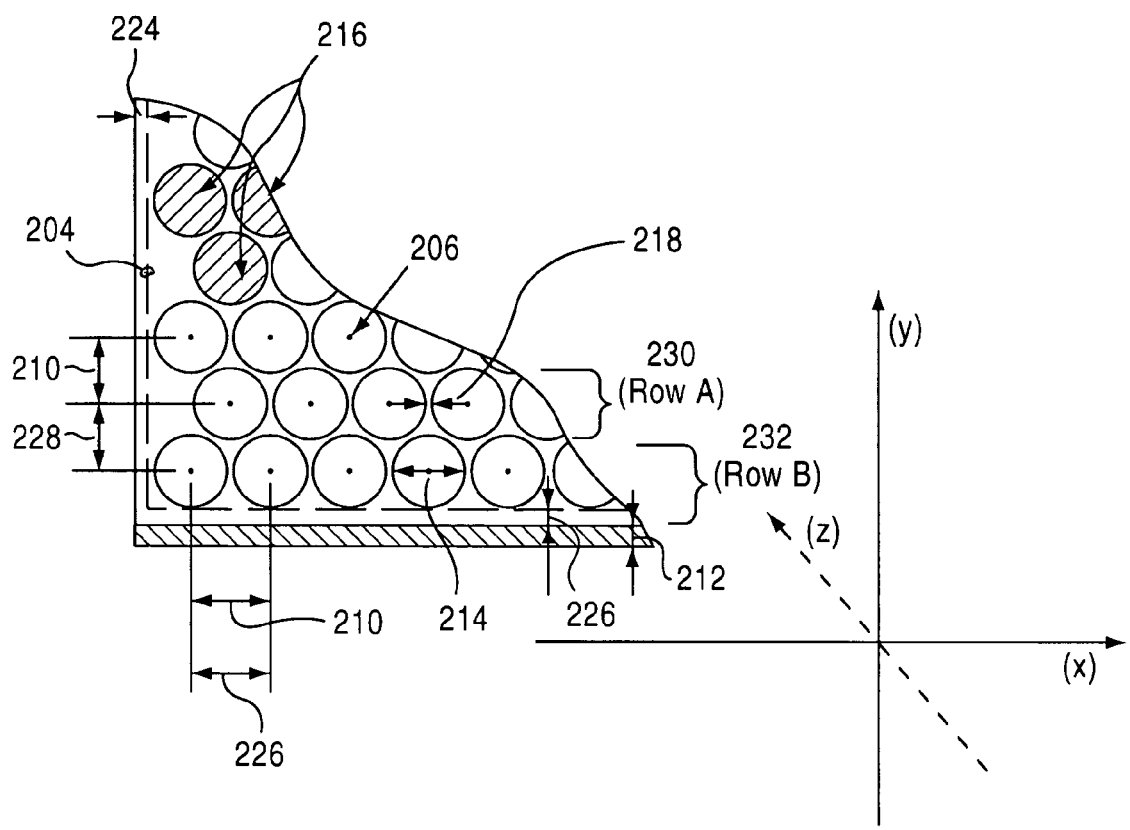
FIG. 3 is a view of an RF Shield including holes according to another embodiment of the present invention.

An exemplary wavepack according to another embodiment of the invention is shown in FIG. 3. The centers of the shield holes 206 are spaced apart by an amount 210 according to the desired characteristics of the shield. Wavepacks can be designed for any RF frequency range. Typically, frequencies between 1 kHz and 10 GHz are of most interest. Once the hole diameter is significantly smaller than the RF wavelength (e.g., $\leq \frac{1}{3}$), the hole is considered a waveguide beyond cutoff and the length-to-diameter ratio of each individual hole is the principal variable that establishes dB attenuation. For example, at 1 GHz, a length-to-diameter ratio of 4 yields an attenuation that varies from −126.5 dB for a 1 inch diameter hole to −127.8 dB for a 0.1 inch diameter hole while the values for a length-to-diameter ratio of 3 cluster about −95 dB.

It is preferred that the thickness of the sheet 212 be approximately four times longer than the diameter 214 of the holes 206 with approximately 65-80% of open area 216. The open area 216 is the combined area of the holes 206 within the shield 204 as compared to the total area of the shield 204. In another example, take the case for frequencies of 1 GHz (1-foot wavelength), a 6" hole 206 would shield frequencies of 1 GHz or higher.

Using a steel plate 1 inch thick with a density of 0.29 lbs/in$^3$ weighing 188.2 lbs raw weight and 40.0 lbs finished weight with a surface area of 8567 in$^2$, a hole diameter 214 of 0.250 inches (alternatively a hexagonal hole with distances of 0.238078 across the flats, 0.274909 across the points, and 0.026922 web thickness), with a minimum webbing 218 between the holes of 0.015 inches, with the width 220 of the shield at 16.75 inches, height 222 of shield at 38.75 inches, a minimum buffer in the X direction 224 at 0.086 inches, minimum buffer in the Y direction 226 at 0.70 inches, horizontal hole to hole spacing 226 at 0.265 inches, vertical row to row spacing 228 at 0.2295 inches, with 62 holes in row A 230, 62 holes in row B 232, a total of 84 "A" rows and 84 "B" rows, with 5,208 "A" holes and 5,208 "B" holes, the total area of all the holes is 511.3 square inches and leaves 78.88% of open area 216.

One skilled in the art will understand that the creation of the holes 206 and their orientation can be accomplished by various manufacturing methods, including, but not limited to, mechanical drilling and application of high pressure water. Furthermore, one skilled in the art will understand that the holes 206 can be of any shape, including, but not limited to circular, hexagonal etc. Therefore, the term "diameter" as used herein can also mean width and/or dimensions of the hole according to its geometric shape.

Figure 4:
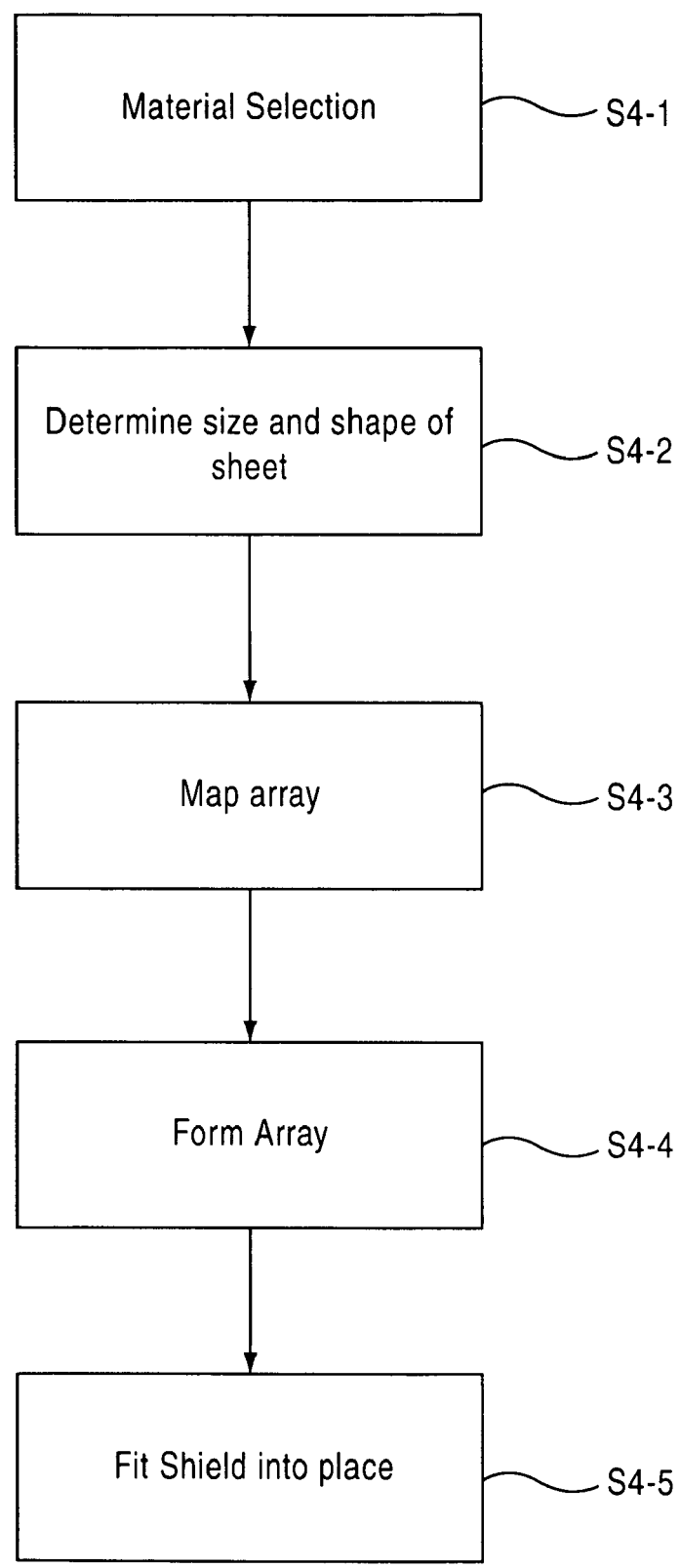
FIG. 4 is a flowchart indicating one way to manufacture the disclosed RF shield.

FIG. 4 shows a flow chart of a method for manufacturing the RF shield according to an embodiment of the present invention. At step S4-1, material is selected of adequate properties, including, but not limited to, conductivity, strength, weight, corrosion resistance, durability, cost and manufacturability. At step S4-2, the size and shape of the sheet 202 is determined, which can be of any size and any shape fit for the given application. At step S4-3, the number, shape, diameter and location of the holes 206 is determined. Typically all the holes are of the same diameter, but holes of differing diameters may be used; for example, smaller holes can be inserted in the triangular portion of the web between the larger holes. These determinations will be based on, among other things, adequacy of RF protection, arbitrary strength sought, and durability in the particular environment. At step S4-4 the holes 206 are cut to form an array 218. Various manufacturing methods can be used to create the holes, including, but not limited to, mechanical drilling and application of high pressure water. For example, a numerical controlled vertical milling machine, such as a HAAS Model VF-488 Vertical Milling Machine, can be used to form the array. Of course, as described above, the holes of the wavepack could be cut with a water jet or other means.

Once the array is formed, a shield can be fitted into place. The shield may be welded, soldered, screwed, bolted, etc. into place. For robustness, full seam welding is the preferred method followed by brazing and soldering. Screwed or bolted joints require special treatment, such as a compatible conductive gasket seal with closely spaced bolts to maintain the shielding effectiveness. Flanged sides could be provided to form a weld lip or with machine fittings for easier implementation.

Other embodiments of the present invention can involve larger or smaller thickness 212 to diameter 214 ratios, larger or smaller percent of open area 216, various geometric shapes of the holes 206, various geometric shapes of the shield 204, use of different conductive materials that have various weight and strength characteristics, with the degree of all of these and other variations at the discretion of the designer depending on the application and arbitrary strength sought.

One important advantage the present invention has over the prior art is robustness and strength. A 2-foot by 4-foot wavepack can be placed in flooring and walked upon. A 250 pound load in the center will bow the wavepack only about 0.06 inches and the wavepack can handle a load of over 800 pounds before failing. Conversely, a 2-foot by 4-foot brazed foil, stainless steel honeycomb will deflect nearly as much under its own weight and will be damaged by putting a minor force on it, such as by pushing on it.

Figure 5:
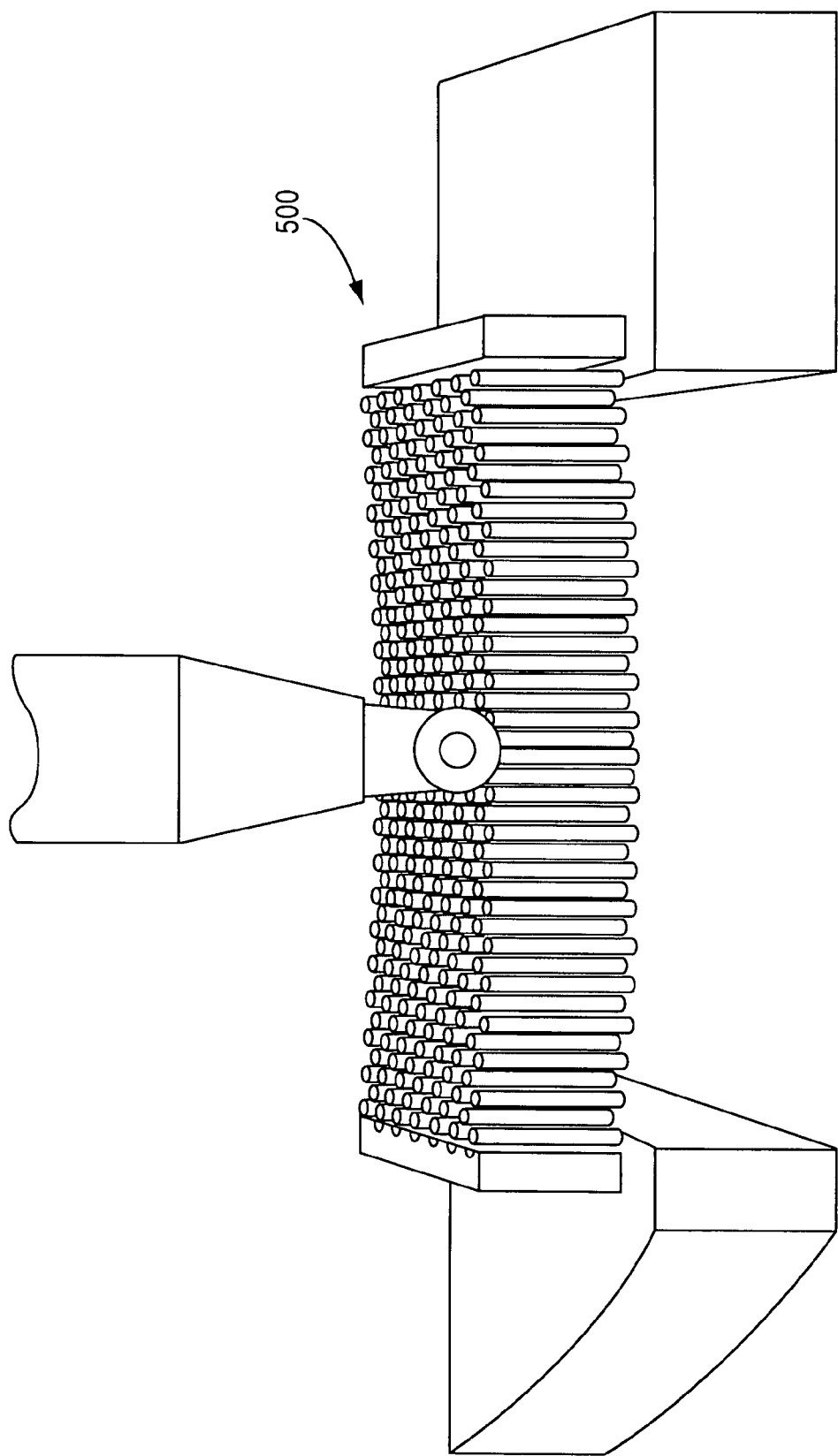
FIG. 5 is an image of an RF shield during a stress test according to the present invention.

FIG. 5 is an image of a prototype wavepack 500 in the midst of a strength test being performed thereon. Note that the thick metal shield 500 barely flexes under pressure. As shown in the image, the wavepack 500 is fabricated from a solid piece of conductor—here, A36 steel. Strength and robustness are obvious from the image, which shows clearly the solid metal between the holes and lack of welds.

Figure 6:
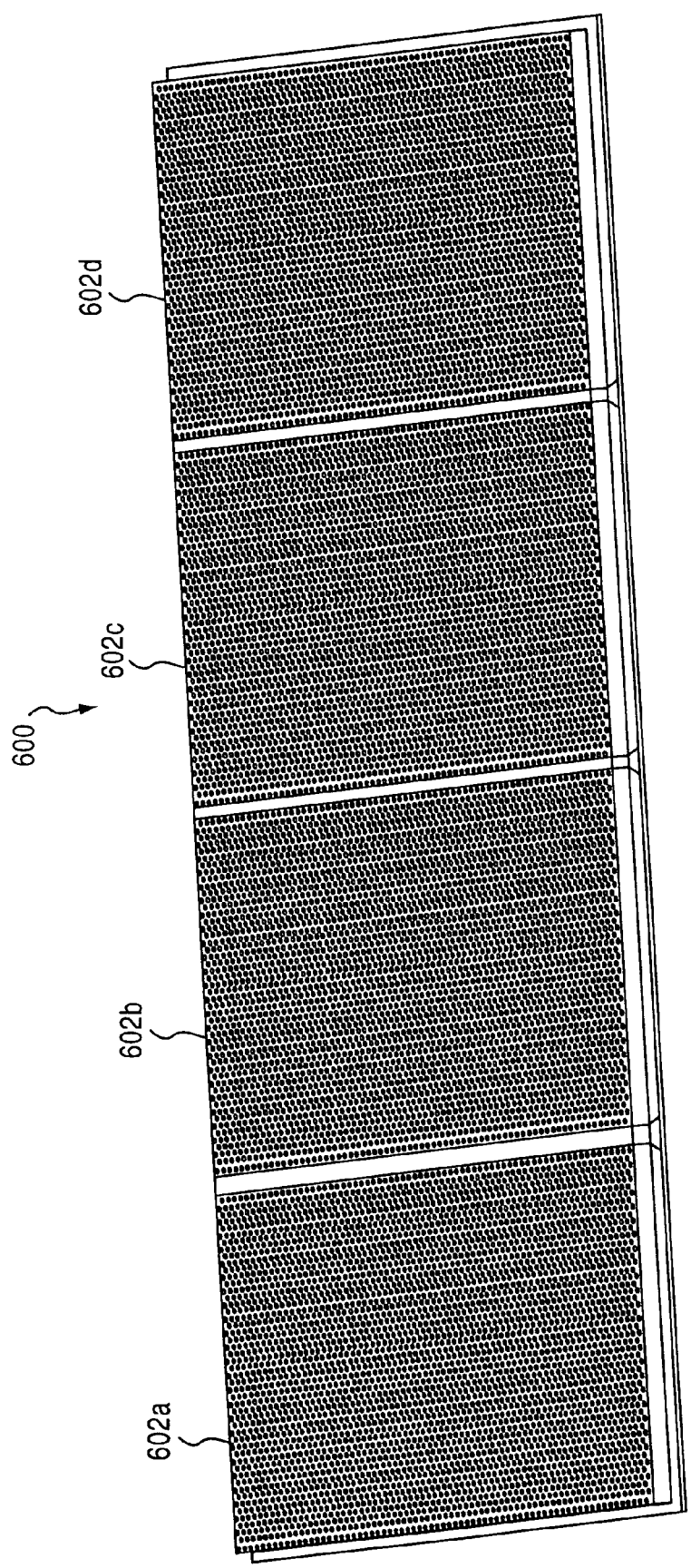
FIG. 6 is an image of an RF shield according to another embodiment of the present invention.

FIG. 6 is an image of an RF shield according to another embodiment of the present invention. The RF shield 600 includes 4 panels 602a-d, which are welded together. The whole assembly 600 is nickel plated after welding for corrosion control. Wavepacks can be fabricated from other metals, such as stainless steel, for corrosion control. Painting or powder coating is also an option for corrosion control; however, one should understand that the thickness of the paint layer will reduce the percent open area more than the thinner nickel plating.

Figure 7:
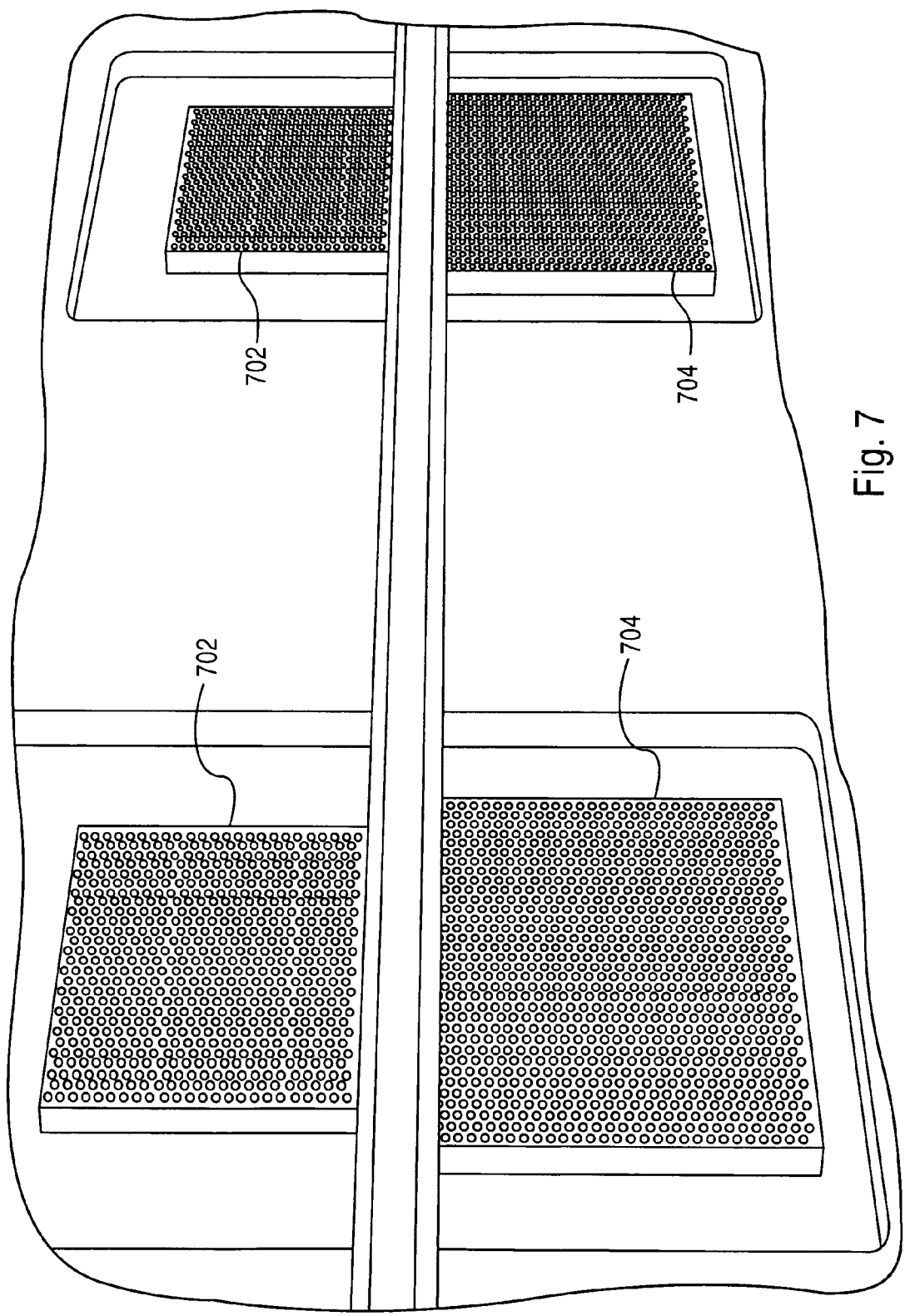
FIG. 7 is an image showing RF shields installed in a Faraday shield wall according to an embodiment of the present invention.

FIG. 7 is an image showing RF shields with hexagonal holes installed in a Faraday shield wall according to an embodiment of the present invention. The wavepack 700 shown is used to cool/heat an electronics enclosure using a small HVAC system outside the Farady shield. Supply air enters the protected area through the top array 702 and return air exits through the larger bottom portion 704.

Figure 8:
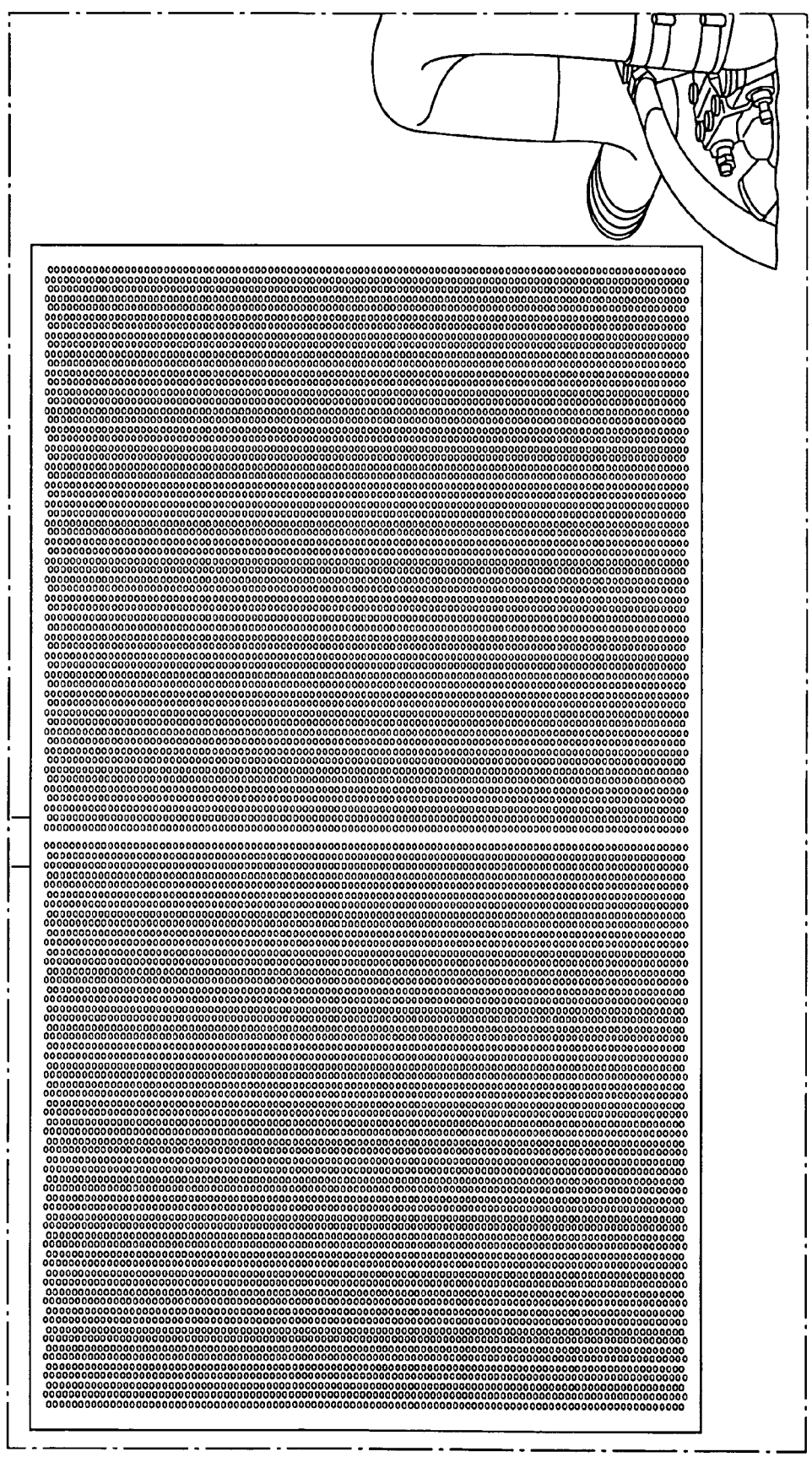
FIG. 8 is an image showing an RF shield installed in front of an engine room exhaust fan according to an embodiment of the present invention.

FIG. 8 is an image showing an RF shield installed in front of an engine room exhaust fan according to an embodiment of the present invention. The wavepack 800 has a hexagonal array of holes sufficient to allow free flow of exhaust air.

Figure 9A:
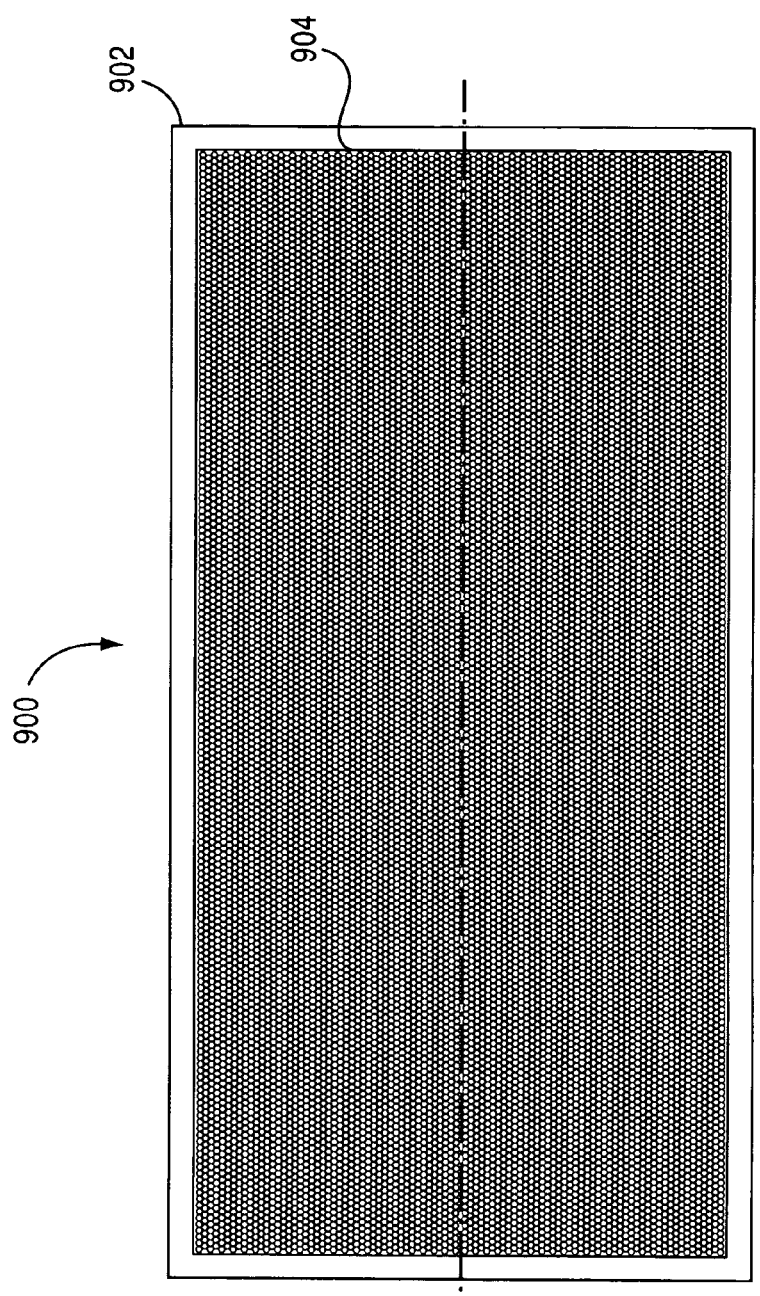
FIGS. 9a-b shows a schematic of an RF shield according to another embodiment of the present invention.
Figure 9B:
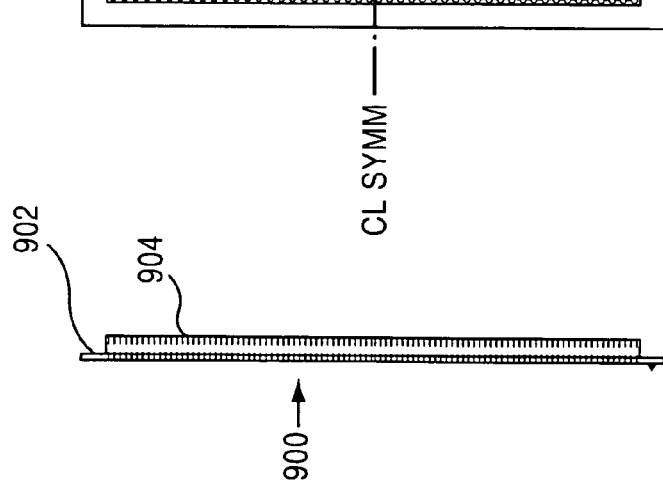

FIGS. 9a-b shows another embodiment of the present invention. As shown, the RF shield 900 has an integral weld lip 902 that is not as thick as the array 904. This lip 902 allows for easier welding of the RF shield 900 to the thinner Faraday shield wall. It should be understood that the RF shield 900 could be fabricate to have flanged sides or a fitted frame, or to include any structural feature on the periphery that makes it easier to incorporate into another structure.

Thus, a number of preferred embodiments have been fully described above with reference to the drawing figures. Although the invention has been described based upon these preferred embodiments, it would be apparent to those of skill in the art that certain modifications, variations, and alternative constructions could be made to the described embodiments within the spirit and scope of the invention.

I claim:

1. An RF shield for blocking electromagnetic radiation while allowing for fluid or air flow therethrough, comprising:

a plate of metal or metal alloy, said metal or metal alloy plate having a predetermined thickness measured in a first direction, and cross-sectional area in a first plane perpendicular to the first direction; and said plate having an array of holes bored therethrough in the first direction;

wherein said predetermined thickness is at least 3 times the diameter of said holes.

2. The shield as recited in claim 1, wherein said metal or metal alloy plate comprises a metal selected from the group consisting of aluminum, steel, zirconium, copper, and titanium.

3. The shield as recited in claim 1, wherein each of said holes in said array are a same size.

4. The shield as recited in claim 1, wherein each of said holes in said array is hexagonal in shape.

5. The shield as recited in claim 1, wherein a total cross sectional area of said holes in said array is at least 65 percent of a total cross sectional area of said plate.

6. The shield as recited in claim 1, wherein a 10 GHz wave transmitted into said shield is attenuated more than −100 dB.

7. The shield as recited in claim 1, wherein said sheet has a width of 2 feet, a length of 4 feet, a thickness of 1 inch, and each said holes in said array has a diameter of less than or equal to 0.25 inches.

8. A method for manufacturing a shield for blocking electromagnetic radiation, comprising the steps of:
 (a) providing a solid piece of metal or metal alloy having a pre-selected length, width, and thickness;
 (b) forming an array of holes therethrough in a direction perpendicular to said length and said width;
 wherein each of said holes in said array has a diameter less than ⅓ said thickness.

9. The method as recited in claim 8, further comprising a step of selecting metal or metal alloys to include a metal from a group consisting of steel, aluminum, copper, or other metal compatible with the shield wall.

10. The method as recited in claim 8, wherein the sum of the cross sectional areas of said holes in said array is greater than 65% of said length times said width.

11. The method as recited in claim 8, wherein said forming step comprises a step of drilling said holes.

12. The method as recited in claim 8, wherein said holes are formed to have a hexagonal shape.

13. The method as recited in claim 8, wherein said holes are formed to be circular in shape.

14. The method as recited in claim 8, wherein said forming step comprises a step of cutting said holes with a water jet.

15. The method as recited in claim 8, further comprising a step of welding said sheet to a Faraday cage in order to provide for air or fluid flow into the Faraday cage or visibility through the Faraday cage wall.

\* \* \* \* \*

(12) EX PARTE REEXAMINATION CERTIFICATE (10851st)
United States Patent
Preonas

(10) Number: US 7,371,977 C1
(45) Certificate Issued: Apr. 21, 2016

(54) RF SHIELD AND METHOD FOR FABRICATING THE SAME

(75) Inventor: Diamantis Drakos Preonas, Albuquerque, NM (US)

(73) Assignee: L-3 COMMUNICATIONS CORPORATION, New York, NY (US)

Reexamination Request:
No. 90/013,507, May 13, 2015

Reexamination Certificate for:
| Patent No.: | 7,371,977 |
|---|---|
| Issued: | May 13, 2008 |
| Appl. No.: | 11/258,386 |
| Filed: | Oct. 26, 2005 |

(51) Int. Cl.
*H05K 9/00* (2006.01)
*H02B 1/56* (2006.01)

(52) U.S. Cl.
CPC ............ *H05K 9/00* (2013.01); *H05K 9/0041* (2013.01)

(58) Field of Classification Search
None
See application file for complete search history.

(56) References Cited

To view the complete listing of prior art documents cited during the proceeding for Reexamination Control Number 90/013,507, please refer to the USPTO's public Patent Application Information Retrieval (PAIR) system under the Display References tab.

*Primary Examiner* — Catherine S Williams

(57) ABSTRACT

An RF shield is fabricated from a solid piece of metal or metal alloy. Holes are cut through the metal or metal alloy at fixed positions to form an array. The diameter of the holes is selected to be significantly smaller than the RF wavelength (e.g., ⅓) it is designed to prevent from passing through the holes. The thickness of the plate (length of the holes) establishes the attenuation of the shield. The number of holes establishes the air or other fluid throughput.

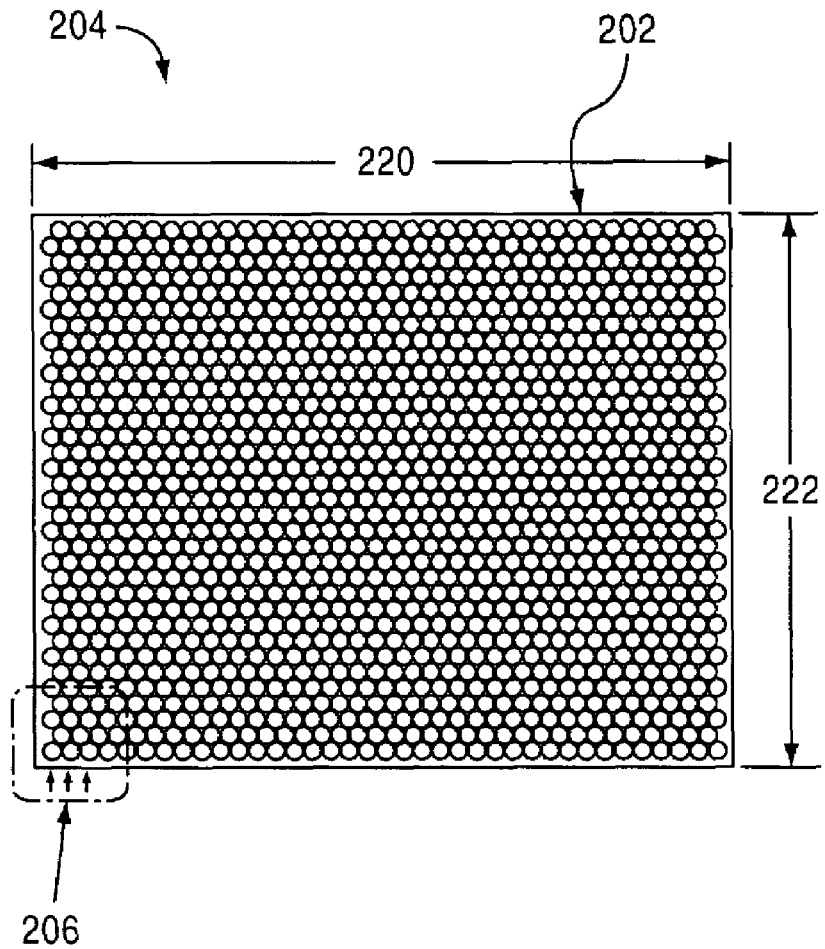

EX PARTE REEXAMINATION CERTIFICATE

THE PATENT IS HEREBY AMENDED AS INDICATED BELOW.

AS A RESULT OF REEXAMINATION, IT HAS BEEN DETERMINED THAT:

Claims 1-15 are cancelled.

\* \* \* \* \*